(12) United States Patent
Lehobey et al.

(10) Patent No.: US 7,409,629 B2
(45) Date of Patent: Aug. 5, 2008

(54) METHODS AND DEVICES FOR DECODING ONE-POINT ALGEBRAIC GEOMETRIC CODES

(75) Inventors: Frédéric Lehobey, Rennes (FR); Philippe Piret, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 621 days.

(21) Appl. No.: 10/673,288

(22) Filed: Sep. 30, 2003

(65) Prior Publication Data

US 2004/0117719 A1   Jun. 17, 2004

(30) Foreign Application Priority Data

Sep. 30, 2002 (FR) ................................ 02 12069

(51) Int. Cl.
*H03M 13/00* (2006.01)

(52) U.S. Cl. .................................... 714/785
(58) Field of Classification Search ................ 714/785
See application file for complete search history.

(56) References Cited

U.S. PATENT DOCUMENTS

| | | | | |
|---|---|---|---|---|
| 5,905,739 | A | 5/1999 | Piret et al. | 371/37.01 |
| 6,456,830 | B2 | 2/2002 | Ogino et al. | 455/134 |
| 6,993,698 | B2 | 7/2002 | Piret | 714/781 |
| 6,543,021 | B1 | 4/2003 | Piret | 714/752 |
| 6,578,170 | B1 | 6/2003 | Piret et al. | 714/758 |
| 6,578,171 | B1 | 6/2003 | Braneci et al. | 714/786 |
| 6,638,318 | B1 | 10/2003 | Piret et al. | 718/781 |
| 6,766,489 | B1 | 7/2004 | Piret et al. | 714/755 |
| 7,069,492 | B2 | 6/2006 | Piret | 714/762 |

FOREIGN PATENT DOCUMENTS

EP  0611054 A2  8/1994

OTHER PUBLICATIONS

Olshevsky et al., A displacement appraach to efficeint decoing if algebraic-geometric codes, 1999, ACM, p. 235-244.*
Shokrollahi et al., Decoding algebraic-geometric codes beyond the error correction bound, 1998 ACM, p. 241-248.*

(Continued)

*Primary Examiner*—Shelly A Chase
(74) *Attorney, Agent, or Firm*—Fitzpatrick, Cella, Harper & Scinto

(57) ABSTRACT

A method of decoding a one-point algebraic geometric code of dimension k and length n, in which, in order to identify the position of the errors in a received word, the syndromes matrix S, of size $(n-k)\times(n-k)$, is defined, of which the elements $S_{ij}$ of each line i are calculated, for j between 1 and w(i), where the boundary w is a decreasing function, using the syndrome s of the received word. Matrices $S^u$ are constructed for the successive values of u starting with $S^1=S$, and, for $u>1$, each matrix $S^u$ is obtained by performing on the matrix $S^{u-1}$, column permutations where appropriate, then linear manipulations involving the line of index u. These steps are performed in such a manner as to find a matrix $S^\lambda$ which has a line of index less than or equal to $\lambda$ of which the elements are zero in the first $w(\lambda)$ columns. The invention also relates to devices and apparatuses adapted to implement this method.

16 Claims, 7 Drawing Sheets

OTHER PUBLICATIONS

Pellikaan, Rund, On the efficient decoding of albebraic-geometric codes, 1993, Google.com, p. 1-24.*

Duursma I. M., "Algebraic Decoding Using Special Divisors", IEEE Transactions on Information Theory, IEEE Inc., New York, U.S., vol. 39, No. 2, Mar. 1, 1993, pp. 694-698.

Hoeholdt T. et al., "On The Decoding Of Algebraic-Geometric Codes", IEEE Transactions on Information Theory, IEEE Inc., New York, U.S., vol. 41, No. 6, Nov. 1995, pp. 1589-1614.

Skorobogatov A. N. et al., "On The Decoding Of Algebraic-Geometric Codes", IEEE Transactions On Information Theory, IEEE Inc., New York, U.S., vol. 36, No. 5, Sep. 1, 1990, pp. 1051-1060.

Gui-Liang Feng et al., "Simplified Understanding And Efficient Decoding Of A Class Of Algebraic-Geometric Codes", IEEE Transactions On Information Theory, IEEE Inc. New York, U.S., vol. 40, No. 4, Jul. 1, 1994, pp. 981-1002.

Pellikaan R. et al., "Which Linear Codes Are Algebraic-Geometric?" IEEE Transactions On Information Theory, IEEE Inc., New York, U.S., vol. 37, No. 3, May 1, 1991, pp. 583-602.

J.H. Van Lint, "Coding Theory and Design Theory", Part 1, IMA Volumes Math. Appl., vol. 21, pp. 137-162, Springer-Verlag, Berlin, 1990.

R. Kotter, "Fast Generalized Minimum-Distance Decoding of Algebraic Geometry and Reed-Solomon Codes", IEEE Transaction on the Information Theory, vol. 42, No. 3, pp. 721-737, May 1996.

G.L. Feng, et al. "Decoding Algebraic Geometric Codes up to the Designed Minimum Distance", IEEE Transactions on Information Theory, vol. 39, No. 1, pp. 37-45, Jan. 1993.

G.L. Feng et al., "A Generalization of the Berlekamp-Massey Algorithm for Multisequence Shift-Register Synthesis with Applications to Decoding Cycle Codes", IEEE Transactions on Information Theory, vol. 37, No. 5, pp. 1274-1287, Sep. 1991.

I. Duursma, "Decoding Codes from Curves and Cyclic Codes", Eindhoven University of Technology, 1993.

* cited by examiner

| $i$ | $h_i$ | $w(i)$ |
|---|---|---|
| 1 | 1 | 32 |
| 2 | x | 30 |
| 3 | $x^2$ | 28 |
| 4 | $x^3$ | 26 |
| 5 | $x^4$ | 24 |
| 6 | $x^5$ | 22 |
| 7 | $x^6$ | 20 |
| 8 | $x^7$ | 18 |
| 9 | $x^8$ | 16 |
| 10 | y | 15 |
| 11 | $x^9$ | 14 |
| 12 | xy | 13 |
| 13 | $x^{10}$ | 12 |
| 14 | $x^2y$ | 11 |
| 15 | $x^{11}$ | 10 |
| 16 | $x^3y$ | 9 |
| 17 | $x^{12}$ | 8 |
| 18 | $x^4y$ | 8 |
| 19 | $x^{13}$ | 7 |
| 20 | $x^5y$ | 7 |
| 21 | $x^{14}$ | 6 |
| 22 | $x^6y$ | 6 |
| 23 | $x^{15}$ | 5 |
| 24 | $x^7y$ | 5 |
| 25 | $x^{16}$ | 4 |
| 26 | $x^8y$ | 4 |
| 27 | $x^{17}$ | 3 |
| 28 | $x^9y$ | 3 |
| 29 | $x^{18}$ | 2 |
| 30 | $x^{10}y$ | 2 |
| 31 | $x^{19}$ | 1 |
| 32 | $x^{11}y$ | 1 |

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| 1 | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ | $S_{13}$ | $S_{14}$ | $S_{15}$ | $S_{16}$ | $S_{17}$ | $S_{18}$ | $S_{19}$ | $S_{20}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | $S_{32}$ |
| 2 | $S_2$ | $S_3$ | $S_4$ | $S_5$ | $S_6$ | $S_7$ | $S_8$ | $S_9$ | $S_{11}$ | $S_{12}$ | $S_{13}$ | $S_{14}$ | $S_{15}$ | $S_{16}$ | $S_{17}$ | $S_{18}$ | $S_{19}$ | $S_{20}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | $S_{32}$ | | |
| 3 | $S_3$ | $S_4$ | $S_5$ | $S_6$ | $S_7$ | $S_8$ | $S_9$ | $S_{11}$ | $S_{13}$ | $S_{14}$ | $S_{15}$ | $S_{16}$ | $S_{17}$ | $S_{18}$ | $S_{19}$ | $S_{20}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | | | | | |
| 4 | $S_4$ | $S_5$ | $S_6$ | $S_7$ | $S_8$ | $S_9$ | $S_{11}$ | $S_{13}$ | $S_{15}$ | $S_{16}$ | $S_{17}$ | $S_{18}$ | $S_{19}$ | $S_{20}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | $S_{32}$ | | | | | | |
| 5 | $S_5$ | $S_6$ | $S_7$ | $S_8$ | $S_9$ | $S_{11}$ | $S_{13}$ | $S_{15}$ | $S_{17}$ | $S_{18}$ | $S_{19}$ | $S_{20}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | | | | | | | | | |
| 6 | $S_6$ | $S_7$ | $S_8$ | $S_9$ | $S_{11}$ | $S_{13}$ | $S_{15}$ | $S_{17}$ | $S_{19}$ | $S_{20}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | $S_{32}$ | | | | | | | | | | |
| 7 | $S_7$ | $S_8$ | $S_9$ | $S_{11}$ | $S_{13}$ | $S_{15}$ | $S_{17}$ | $S_{19}$ | $S_{21}$ | $S_{22}$ | $S_{23}$ | $S_{24}$ | $S_{25}$ | $S_{26}$ | $S_{27}$ | $S_{28}$ | $S_{29}$ | $S_{30}$ | $S_{31}$ | | | | | | | | | | | | | |
| 8 | $S_8$ | $S_9$ | $S_{11}$ | $S_{13}$ | $S_{15}$ | $S_{17}$ | $S_{19}$ | $S_{21}$ | $S_{23}$ | $S_{24}$ | $S_{25}$ | $S_{26}$ | $S_{27}$ | $S_{28}$ | $S_{29}$ | $S_{30}$ | $S_{31}$ | $S_{32}$ | | | | | | | | | | | | | | |
| 9 | $S_9$ | $S_{11}$ | $S_{13}$ | $S_{15}$ | $S_{17}$ | $S_{19}$ | $S_{21}$ | $S_{23}$ | $S_{25}$ | $S_{26}$ | $S_{27}$ | $S_{28}$ | $S_{29}$ | $S_{30}$ | | | | | | | | | | | | | | | | | | |
| 10 | $S_{10}$ | $S_{12}$ | $S_{14}$ | $S_{16}$ | $S_{18}$ | $S_{20}$ | $S_{22}$ | $S_{24}$ | $S_{26}$ | $S_{27}+S_{10}$ | $S_{28}$ | $S_{29}+S_{12}$ | $S_{30}$ | | | | | | | | | | | | | | | | | | | |
| 11 | $S_{11}$ | $S_{13}$ | $S_{15}$ | $S_{17}$ | $S_{19}$ | $S_{21}$ | $S_{23}$ | $S_{25}$ | $S_{27}$ | $S_{28}$ | $S_{29}$ | $S_{30}$ | $S_{31}$ | | | | | | | | | | | | | | | | | | | |
| 12 | $S_{12}$ | $S_{14}$ | $S_{16}$ | $S_{18}$ | $S_{20}$ | $S_{22}$ | $S_{24}$ | $S_{26}$ | $S_{28}$ | $S_{29}+S_{12}$ | $S_{30}$ | $S_{31}+S_{14}$ | $S_{32}$ | | | | | | | | | | | | | | | | | | | |
| 13 | $S_{13}$ | $S_{15}$ | $S_{17}$ | $S_{19}$ | $S_{21}$ | $S_{23}$ | $S_{25}$ | $S_{27}$ | $S_{29}$ | $S_{30}$ | $S_{31}$ | $S_{32}$ | | | | | | | | | | | | | | | | | | | | |

METHODS AND DEVICES FOR DECODING ONE-POINT ALGEBRAIC GEOMETRIC CODES

FIELD OF THE INVENTION

The present invention concerns communication systems in which, in order to improve the fidelity of the transmission, the data to be transmitted are subjected to a channel encoding. It concerns more particularly a decoding method, as well as the devices and apparatus adapted to implement this method.

BACKGROUND OF THE INVENTION

It will be recalled that so-called "channel" encoding consists, when the "code words" sent to the receiver are formed, of introducing a certain amount of redundancy in the data to be transmitted. More particularly, by means of each code word, a predetermined number k of information symbols are transmitted which are chosen from a predetermined "alphabet" of finite size q; to these k information symbols are added a number (n–k) of so-called "parity" symbols, taken from the same alphabet, so as to form code words $\underline{c}=(c_1,c_2,\ldots,c_n)$ of length n; the set of the rules for calculation of the parity symbols as a function of the information symbols defines a "code", or "encoding method", of "dimension" k and "length" n, thus characterized by a certain number of code words constituting a sort of dictionary. A code may be conveniently defined by means of a matrix H, of size (n–k)×n, termed "parity matrix": a word $\underline{c}$ of given length n is a code word if, and only if, it satisfies the relationship: $H \cdot \underline{c}^T = 0$ (where the exponent T indicates the transposition).

At the receiver, the associated decoding method then judiciously uses this redundancy to detect any transmission errors and if possible to correct them. There is a transmission error if the difference $\underline{e}$ between a received word $\underline{r}$ and the corresponding code word $\underline{c}$ sent by the transmitter is non-zero.

More particularly, the decoding is carried out in two main steps.

The first step consists of associating an "associated code word" with the received word. To do this, the decoder first of all calculates the "error syndrome" $\underline{s}=H \cdot \underline{r}^T = H \cdot \underline{e}^T$. If the syndrome is zero, it is assumed that no transmission error has occurred, and the "associated code word" will then simply be taken to be equal to the received word. If that is not the case, it is thereby deduced that some symbols in the received word are erroneous, and a correction algorithm is then implemented which is adapted to estimate the value of the error $\underline{e}$; the algorithm will thus provide an estimated value $\hat{\underline{e}}$ such that $(\underline{r}-\hat{\underline{e}})$ is a code word, which will then constitute the "associated code word".

The second step simply consists in reversing the encoding method, that is to say in removing the redundant symbols from the "associated code word" to retrieve the initial information symbols.

More particularly, the invention concerns the first of these two steps, and the conditions for implementation of the correction algorithm.

The purpose of a correction algorithm is to associate with the received word the code word situated at the shortest Hamming distance from this received word, the "Hamming distance" being, by definition, the number of places where two words of the same length have a different symbol. Each code thus provides an error correction capacity which is limited by the shortest Hamming distance between any two code words, which is termed the "minimum distance" of the code d; more particularly, when the chosen correction algorithm is used to find the position of possible errors in any received word, and to provide a replacement symbol for each of these positions, one can be sure of being able to optimally correct $\mathrm{INT}[(d-1)/2]$ errors for a code of minimum distance d ("INT" designates the integer part). If the received word contains a number of errors strictly greater than $\mathrm{INT}[(d-1)/2]$, the algorithm will in certain cases capable of proposing a correction, but it will then of course be very doubtful that such a correction will be right, that is to say that the associated code word really is the code word sent by the transmitter.

The capability of a correction algorithm to propose a correction of a received word is faithfully represented by the formula:

$$2t \leq \Delta,$$

where t is the number of erroneous symbols in the received word, and $\Delta$ is a strictly positive integer which we will call the "solving capability" of the algorithm. If the value of (2t) is less than or equal to the solving capability, the correction algorithm will be capable of correcting the received word. If the value of (2t) is greater than the solving capability, the algorithm can:

either simply fail in its correction attempt, or be capable of proposing a correction of the received word; in this case, if that correction is accepted, the risk is taken of it being erroneous, i.e. that the code word proposed is not in fact the word sent; clearly, the greater (2t) is with respect to $\Delta$, the higher the risk.

Taking into account the above considerations concerning the minimum distance d of the code, the algorithm considered will be said to be "maximum" if $$\Delta = d-1,$$

and "sub-maximum" if $$\Delta < d-1.$$

Among known encoding methods, "Reed-Solomon" codes may be cited, which are reputed for their efficiency. These codes, however, have the particularity that the length n of the code words is necessarily less than or equal to the size q of the alphabet of the symbols. On account of this, if a Reed-Solomon code is desired having code words of great length, high values of q must be envisaged, which leads to costly implementations in terms of calculation and storage in memory. Moreover, high values of q are sometimes ill-adapted to the technical application envisaged.

However, for modern information carriers, for example in recordings on CD ("compact discs") and DVD ("digital video discs"), it is sought to increase the density of information. When such a carrier is affected by a physical defect such as a scratch, a high number of information symbols may be rendered unreadable. This problem may nevertheless be remedied using very long code words. For this reason, it has been sought to build codes which naturally provide words of greater length than Reed-Solomon codes.

In particular so-called "algebraic geometric codes" or "Goppa geometric codes" have recently been proposed (see for example "*Algebraic Geometric Codes*" by par J. H. van Lint, in "*Coding Theory and Design Theory*" $1^{st}$ part, *IMA Volumes Math. Appl.*, volume 21, Springer-Verlag, Berlin, 1990). These codes are constructed from algebraic curves defined on the basis of an alphabet of q elements structured into a Galois field. An important parameter of such a curve is its "genus" g. In the particular case where the curve is a simple straight line (the genus g is then zero), the algebraic geometric code reduces to a Reed-Solomon code. In certain cases, algebraic geometric codes make it possible to achieve a length equal to $(q+2g\sqrt{q})$, which may be very high; for example, with an alphabet length of 256 and a genus equal to 120, code words are obtained of length 4096.

Algebraic geometric codes are, as has been said, advantageous as to the length of the code words, but they have the drawback of requiring (on the basis of current knowledge at least) decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capacity of the decoder. (see for example the article by Tom Høholdt and Ruud Pellikaan entitled "*On the Decoding of Algebraic-Geometric Codes*", *IEEE Trans. Inform. Theory*, vol. 41 no. 6, pages 1589 to 1614, November 1995).

It should be noted that for these algorithms, only a lower bound of their solving capability $\Delta$ is available, except in the "trivial" case of the maximum algorithm for correction of Reed-Solomon codes (called the "Berlekamp-Massey algorithm"), for which the solving capability is precisely known and is equal to $\Delta=n-k$. A generalization of this algorithm to non-zero algebraic geometric codes, termed "basic" algorithm, has been proposed by A. N. Skorobogatov and S. G. Vladut, in the article entitled "*On the Decoding of Algebraic-Geometric codes*", *IEEE Trans. Inform. Theory*, vol. 36 no. 5, pages 1051 to 1060, November 1990), this algorithm provides a solving capability at least equal to $\Delta=n-k-2g$.

However, the minimum distance d for a algebraic geometric code is at least equal to $(n-k+1-g)$. It is thus clear that the basic algorithm is "sub-maximum", and this is all the more so the greater the genus g of the algebraic curve. With the aim of improving the solving capability, Skorobogatov and Vladut proposed, in the same article cited above, a "modified" version of the "basic" algorithm. This "modified" algorithm has a solving capability at least equal to $\Delta=n-k-g-s$, where s is a parameter dependent on the algebraic curve chosen, which may furthermore sometimes be zero (this is the case for example for so-called "hyperelliptic" algebraic curves.

The basic algorithm proceeds essentially in three steps:
1) constructing a "syndromes matrix" S, of size $(n-k)\times(n-k)$, of which each coefficient $S_{ij}$, where j is less than or equal to a "boundary" value w(i), is equal to a linear combination judiciously chosen of the elements $s_v$ (v=1,2, ..., n-k) of the syndrome $\underline{s}$, the coefficients $S_{ij}$ beyond the boundary remaining indeterminate,
2) identifying the position of the errors in the received word, by solving a certain number of linear equations of which the coefficients are taken from the syndromes matrix S, and
3) correcting the erroneous symbols of the received word of which the position is now known.

The modification introduced by the modified basic algorithm consists in a new mode of operation for the second step of the algorithm. More particularly, for any integer $\mu$ between 1 and (n-k), the following system of linear equations is considered:

$$\sum_{i=1}^{\mu} l_i S_{ij} = 0, \text{ for } j = 1, 2, \ldots, w(\mu), \quad (1)$$

where the values of the unknowns $l_i$ are to be found in the same alphabet of symbols as the elements of the code words. An integer $\lambda_0$ is then sought which is the smallest value of $\mu$ for which such a system has a non-trivial solution, that is to say a solution where the coefficients $l_i$ are not all zero.

Skorobogatov and Vladut thus teach to consider successively and independently the sub-matrices of S size $\mu \times w(\mu)$, first for $\mu$ equal to 1, then for $\mu$ equal to 2, and so forth until one is found for which the lines are linearly dependent.

However, a question which is important from a practical point of view and which must be posed in relation to any calculation algorithm, is that of its complexity, that is to say the number of arithmetical operations which it requires. It can be shown that the solution of the modified basic algorithm, as succinctly described above, requires of the order of $n^4$ arithmetical operations (in the symbols alphabet), where n is, it should be recalled, the length of the codewords. However, the complexity of the basic algorithm is only of the order of $n^3$. In this manner the increase in the solving capability according to this approach is thus made at the cost of an increase in complexity.

SUMMARY OF THE INVENTION

The object of the present invention is in particular to find a decoding algorithm which has a solving capability at least equal to that of the modified basic algorithm for the same code, but of which the complexity is as low as possible, and increases at most proportional to $n^3$.

The article of I. M. Duursma entitled "*Algebraic Decoding using Special Divisors*" (IEEE Transactions on Information Theory, vol. 39, n° 2, pages 694 to 698, 1993) proposes an improvement (termed "extended modified algorithm" by the author) to the modified basic algorithm, adapted to reduce its complexity. Duursma shows that in general a plurality of values of $\mu$ may exist for which the system (1) has a non-trivial solution, and for which the complete decoding algorithm has the same solving capability as the modified basic algorithm. We will use the term "solving dimension" $\lambda$ to refer to a value of $\mu$ having that property, such that the value $\lambda_0$ mentioned above is re-defined as being the smallest of these solving dimensions. Moreover, the cited article shows that there is at least one solving dimension whose value is greater than or equal to a certain integer, which we will refer to as "Duursma's minimum" $\mu_D$ (for the calculation method for $\mu_D$, that article may be referred to). We will use the term "extended dimension" $\lambda_D$ to refer to the smallest of these solving dimensions greater than or equal to $\mu_D$ ($\lambda_D$ can furthermore occasionally be equal to the smallest solving dimension $\lambda_0$).

Consequently, according to the extended modified algorithm, it is sought to solve the system (1) by considering, as in the basic modified algorithm, successive values of $\mu$, but by beginning that search at $\mu=\mu_D$. The complexity of the extended modified algorithm increases proportional to $gn^3$, however, generally, the genuses g of the algebraic curves used for the encoding may be high numbers: this is because to be able to construct codes that are increasingly long often gives rise to the use of algebraic curves of increasingly high genus.

Decoding algorithms for algebraic geometric codes of which the complexity increases proportional to $n^3$ have been proposed using a different approach to that of the modified algorithm.

The article of G. -L. Feng and T. R .N. Rao entitled "*Decoding Algebraic-Geometric Codes up to the Designed Minimum Distance*" (IEEE Transactions on Information Theory, vol. 39, n° 1, January 1993) discloses such an algorithm. In that algorithm, the system of linear equations of the basic algorithm is solved (see step 2) above), after having determined according to a certain rule the elements unknown a priori of the syndromes matrix (see step 1) above). However, the calculation of these complementary elements of the matrix S is complicated, and consequently, even if the complexity of that algorithm increases proportional to $n^3$, the actual number of operations (equal to $C \cdot n^3$, where C is a constant of high value) is very high.

The article of R. Kötter entitled "*Fast Generalized Minimum-Distance Decoding of Algebraic-Geometry and Reed-Solomon Codes*" (IEEE Transactions on Information Theory, vol. 42, n° 3, May 1996) also discloses such an algorithm. In this one, a solution is sought for all the systems of linear equations conforming to the basic algorithm, whereas just one would suffice. Here too the result is a complexity equal to C' $n^3$, where C' us a constant of high value.

However the authors of the present invention have discovered, contrary to what may have been thought at first sight, that it is in fact possible—at least in relation to algebraic geometric codes of so-called "one-point" type—to define a decoding algorithm of complexity proportional to $n^3$, with a constant of proportionality of the order of 1, while keeping to the general philosophy, and the solving capability, of the modified basic algorithm of Skorobogatov and Vladut, (for a definition of "one-point" algebraic geometric codes, reference may be made for example to the article by Tom Høholdt and Ruud Pellikaan cited above). The invention demonstrates this by providing an algorithm in which the calculations are organized judiciously to that end. More particularly, the invention teaches how it is possible, when it is sought to solve the system of equations (1) for a given value $\mu_0$ of $\mu$, to take into account certain information resulting from unsuccessful attempts to solve the system (1) for values of $\mu$ less than $\mu_0$ (except for $\mu_0$=1); by exploiting this information, the invention makes it possible to considerably reduce the complexity of the calculations required when it is attempted to find a solution for the value $\mu_0$.

Thus, according to a first aspect, the invention relates to a method of decoding a one-point algebraic geometric code of dimension k and length n, in which, in order to identify the position of the errors in a received word, the syndromes matrix S, of size (n–k)×(n–k), is defined, of which the elements $S_{ij}$ of each line i are calculated, for j between 1 and w(i), where the boundary w is a decreasing function, using the syndrome $\underline{s}$ of the received word, said method being remarkable in that it comprises matrix construction steps numbered by u, during which matrices $S^u$ are constructed starting with $S^1$=S, and in that each matrix $S^u$ for u>1 is obtained from the matrix $S^{u-1}$ by performing:

where appropriate, permutations on the columns of the matrix $S^{u-1}$, then linear manipulations involving the line of index u of the matrix so obtained, and in that the construction of matrices terminates when:

either $S^u_{uj}$=0 for all j between 1 and w(u), or there is an integer u*≦(u–1) such that $S^{u^*}_{u^*j}$=0 for all j between 1 and w(u).

"Linear manipulation" involving a line means the replacement of this line by a linear combination of itself with one or more other lines.

The general principle of the method according to the invention is inspired by the so-called "Gauss pivot", taking care to operate only on known elements of the matrix S, that is to say those situated within the "boundary" represented by the function w. As described in detail below, this approach provides the coefficients $l_i$ associated with a solving dimension $\lambda$, with a calculation complexity which is only of the order of $n^3$.

Naturally, the method according to the present invention also makes it possible to determine values of solving dimensions. Thus, according to the same first aspect, the invention also relates to a method of decoding an one-point algebraic geometric code of dimension k and length n, in which, in order to identify the position of the errors in a received word, the syndromes matrix S, of size (n–k)×(n–k), is defined, of which the elements $S_{ij}$ of each line i are calculated, for j between 1 and w(i), where the boundary w is a decreasing function, using the syndrome $\underline{s}$ of the received word, said method being remarkable in that it comprises matrix construction steps numbered by u, during which matrices $S^u$ are constructed starting with $S^1$=S, and in that each matrix $S^u$ for u>1 is obtained from the matrix $S^{u-1}$ by performing:

where appropriate, permutations on the columns of the matrix $S^{u-1}$, then linear manipulations involving the line of index u of the matrix so obtained, and in that the last step is:

either the step number u=$\lambda$, if an integer $\lambda$ is determined such that $S^\lambda_{\lambda j}$=0 for all j between 1 and w($\lambda$), or the step number u=($\lambda$–1), if an integer $\lambda$ and an integer u* are determined, with u*<$\lambda$, such that $S^{u^*}_{u^*j}$=0 for all j between 1 and w($\lambda$).

As may be seen, taking into account the "boundary" w plays a central role in the invention. A notable property of algebraic geometric codes is that the function w always decreases (in the broad sense) when the parity matrix H is constructed in a canonical manner (if this is not the case, it suffices to re-arrange accordingly the order of the lines of the matrix S before implementing the decoding method according to the invention. Thus let $u_{max}$ be the index of the first line for which w($u_{max}$) is less than $u_{max}$. The system (1) for $\mu$=$u_{max}$ then comprises more unknowns than equations: thus of course it has a non-trivial solution. It may be deduced from this that there is necessarily a solving dimension of value less than or equal to $u_{max}$. In the calculations it is consequently of no use to keep the lines of index greater than $u_{max}$ in the matrices $S^u$. The complexity of the calculations and storage will thus preferably be reduced by cutting off the number of lines of each matrix $S^u$ at $u_{max}$.

According to the basic modified algorithm, or according to the extended modified algorithm, after having calculated a set of coefficients $l_i$, the "error-locating polynomial" is formed, the roots of which serve to find the position of the errors in the received word. The present invention is, advantageously, compatible with this known method of locating transmission errors.

According to particular features, the number of columns of each matrix $S^u$ is cut off at w(u). The algorithm according to the invention then provides the smallest solving dimension $\lambda_0$ and the associated coefficients $l_i$. An advantage of this embodiment is that the error-locating polynomial which results from it has a minimum number of coefficients.

According to other particular features, the number of columns of each matrix $S^u$ is cut off at w($\mu_D$) for u between 1 and Duursma's minimum $\mu_D$, and at w(u) for (the case arising) u greater than $\mu_D$. The algorithm according to the invention then provides the extended dimension $\lambda_D$ and the associated coefficients $l_i$. An advantage of this embodiment is to give rise to a reduction in storage, since the matrices $S^u$ can only include w($\mu_D$) columns for u between 1 and $\mu_D$, and w(u) columns for u greater than $\mu_D$.

According to another of its aspects, the invention concerns various devices.

It thus firstly relates to an error correction device for decoding a one-point algebraic geometric code of dimension k and length n, adapted to identify the position of the errors in a received word, and comprising means for defining the syndromes matrix S, of size (n−k)×(n−k), of which the elements $S_{ij}$ of each line i are calculated, for j between 1 and w(i), where the boundary w is a decreasing function, using the syndrome $\underline{s}$ of the received word, said error correction device being remarkable in that it further comprises means for constructing matrices $S^u$ numbered by u, with $S^1 = S$, each matrix $S^u$ for u > 1 being obtained from the matrix $S^{u-1}$ by performing:

where appropriate, permutations on the columns of the matrix $S^{u-1}$, then linear manipulations involving the line of index u of the matrix so obtained, and in that it comprises means for stopping the construction of the matrices when:

either $S^u_{uj} = 0$ for all j between 1 and w(u), or there is an integer $u^* \leq (u-1)$ such that $S^{u^*}_{u^*j} = 0$ for all j between 1 and w(u).

Preferably this error correction device will further comprise means for cutting off the number of lines of each matrix $S^u$ at $u_{max}$, where $u_{max}$ is the smallest integer i for which w(i) is less than i.

According to particular features, the error correction device further comprises means for cutting off the number of columns of each matrix $S^u$ at w(u).

According to other particular features, the error correction device further comprises means for cutting off the number of columns of each matrix $S^u$ at $W(\mu_D)$ for u between 1 and Duursma's minimum $\mu_D$, and at w(u) for (the case arising) u greater than $\mu_D$.

The advantages of these error correction devices are essentially the same as those of the methods complementary thereto described succinctly above.

The invention also concerns, secondly, a decoder comprising:

at least one error correction device as described succinctly above, and at least one redundancy suppression device.

The invention also relates to:

an apparatus for receiving encoded digital signals comprising a decoder as succinctly described above, as well as means for demodulating said encoded digital signals, a computer system comprising a decoder as succinctly described above, and further comprising at least one hard disk, and at least one means for reading that hard disk.

a non-removable data storage means comprising computer program code instructions for the execution of the steps of any one of the methods succinctly described above, a partially or wholly removable data storage means comprising computer program code instructions for the execution of the steps of any one of the methods succinctly described above, and a computer program containing instructions such that, when said program controls a programmable data processing device, said instructions lead to said data processing device implementing one of the methods succinctly described above.

The advantages provided by this decoder, this reception apparatus, this computer system, these data storage means and this computer program are essentially the same as those provided by the methods according to the invention.

BRIEF DESCRIPTION OF THE DRAWINGS

Other aspects and advantages of the invention will emerge from a reading of the following detailed description of particular embodiments, given by way of non-limiting example. The description refers to the accompanying drawings, in which:

FIG. 2 is a list of monomials which form a basis for a function vector space in two variables associated with an algebraic geometric code presented here by way of example, FIG. 3 shows the first 13 lines of the syndromes matrix S in this same code.

DETAILED DESCRIPTION OF THE PREFERRED EMBODIMENTS

Figure 1:
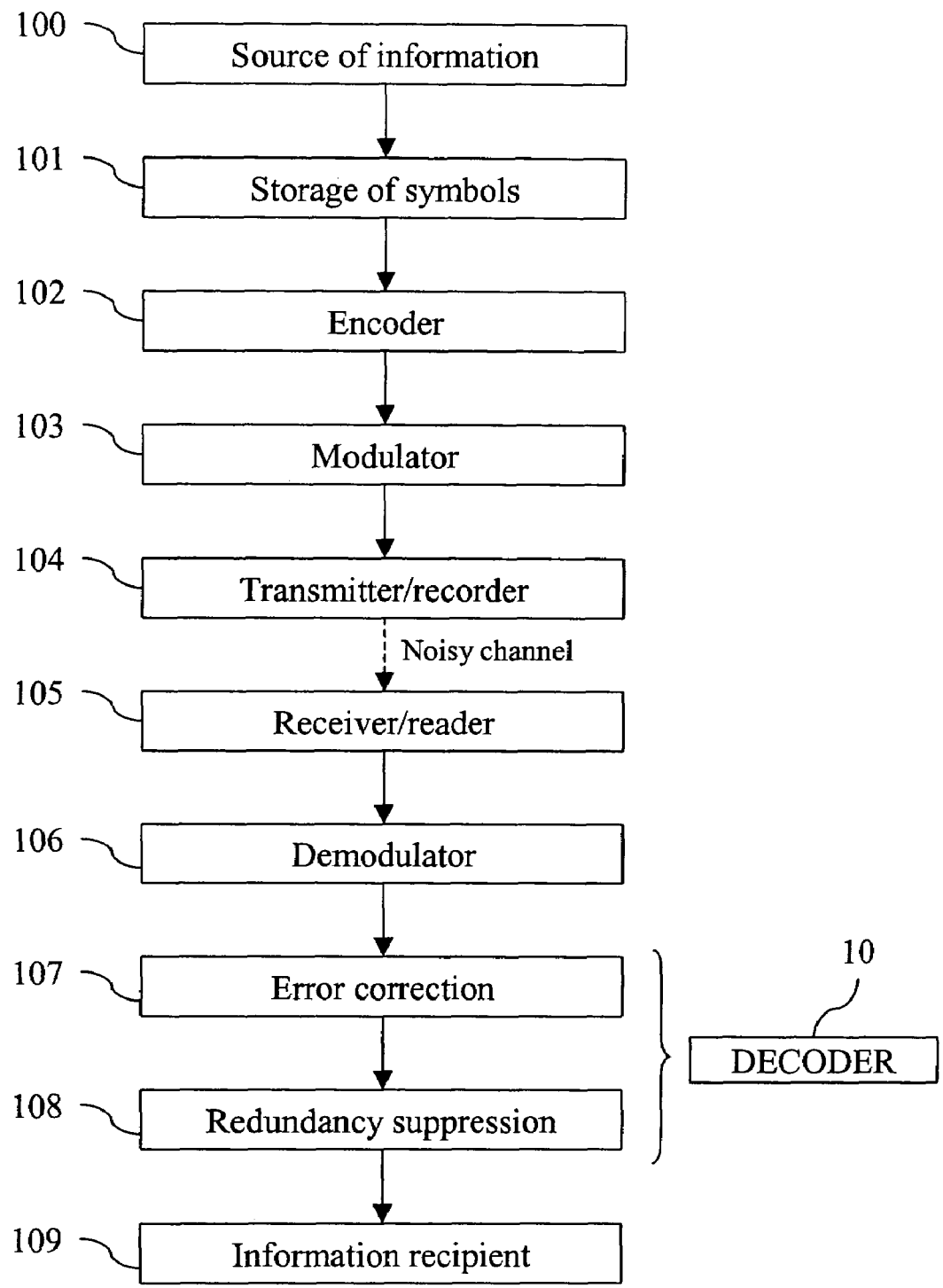
FIG. 1 is a block diagram of a system for transmitting information using a channel encoding according to the invention.

FIG. 1 is a block diagram of a system for transmitting information using a channel encoding and decoding according to the invention.

The function of this system is to transmit information of any nature from a source 100 to a recipient or user 109. First of all, the source 100 puts this information into the form of symbols belonging to a certain alphabet (for example bytes), and transmits these symbols to a storage unit 101, which accumulates the symbols so as to form sets each containing k symbols. Next, each of these sets is transmitted by the storage unit 101 to an encoder 102 which adds (n−k) redundant symbols, so as to construct a code word of length n.

The code words so formed are next transmitted to a modulator 103, which associates a modulation symbol (for example, a complex amplitude) with each symbol of the code word. Next, these modulation symbols are transmitted to a transmitter or to a recorder 104, which inserts the symbols in a transmission channel. This channel may for example be constituted by a wired transmission or wireless transmission such as a radio signal, or by storage on an appropriate carrier such as a DVD or a magnetic tape. This transmission arrives at a receiver or a reader 105, after having been affected by a "transmission noise" whose effect is to modify or delete certain of the modulation symbols at random.

The receiver or reader 105 then transmits these symbols to the demodulator 106, which transforms them into symbols of the alphabet mentioned previously, of which each set constitutes a "received word". The received word is next processed by an error correction unit 107, which implements a decoding method according to the invention, so as to provide an "associated code word". Next, this associated code word is transmitted to a redundancy suppression unit 108, which extracts from it k information symbols by implementing a decoding algorithm that is the reverse of that implemented by the encoder 102. Finally, these information symbols are supplied to their recipient 109.

Units 107 and 108 can be considered to form conjointly a "decoder" 10.

The method of error correction according to the invention will now be illustrated, with the aid of a digital example. Note that this example does not necessarily constitute a preferred choice of parameters for the encoding or decoding. It is provided here to enable the person skilled in the art to understand more easily the operation of the method according to the invention.

An algebraic geometric code will thus be considered with parameters (512, 480) defined as follows.

The alphabet of the symbols is constituted by the 256 elements of the Galois field $F_{256}$. Each non-zero element of this field is equal to a power, between 0 and 254, of one of its elements, denoted $\gamma$, which satisfies the equation $$\gamma^8+\gamma^4+\gamma^3+\gamma^2+1=0,$$

which implies that: $\gamma^{255}=1$.

The following "algebraic curve" is then considered of genus g=8 constituted by the set of the solutions of the equation with two unknowns $$y^2+y+x^{17}=0 \qquad (2)$$

over $F_{256}$ (this equation being of degree 2 in y, it is said to be "hyperelliptic"). These solutions, of which there are 512, constitute the "points of the curve", for example:

$$P_1=(\gamma^0,\gamma^{85}), P_2=(\gamma^0,\gamma^{170}), P_3=(\gamma^1,\gamma^{119}), P_4=(\gamma^1,\gamma^{153}), P_5=(\gamma^2,\gamma^{51}),$$

$$P_{508}=(\gamma^{253},\gamma^{193}), P_{509}=(\gamma^{254},\gamma^{14}), P_{510}=(\gamma^{254},\gamma^{224}), P_{511}=(0,\gamma^0) P_{512}=(0,0).$$

Each point $P_i$ serves to identify the i-th element of any code word; this is why n=512.

Next, a set of monomials $h_i$ (i=1, . . . ,32) in x and y is chosen, of which the list is given in FIG. 2. These monomials constitute a basis for a vector space LF of polynomials in x and y with coefficients in $F_{256}$. The choice of the functions $h_i$ is not random, but obeys certain criteria which define the so-called "one-point" algebraic geometric codes.

Finally, the parity matrix H of the code is defined in the following manner: the element in line i and column j of that matrix is equal to the value of the function $h_i$ at point $P_j$ of the algebraic curve. Thus, n−k=32, and so k=480. For example, taking into account that $\gamma^{255}=1$, the twelfth line of the matrix H is:

$$h_{12}(P_1)=\gamma^{85}, h_{12}(P_2)=\gamma^{170}, h_{12}(P_3)=\gamma^{120}, h_{12}(P_4)=\gamma^{154},$$

$$h_{12}(P_{510})=\gamma^{223}, h_{12}(P_{511})=0, h_{12}(P_{512})=0,$$

since $h_{12}=xy$.

The code having been chosen, it will now be shown how to build the syndromes matrix S.

Consider the 32×32 products of a function $h_i$ by a function $h_j$, defined modulo the equation of the algebraic curve (equation (2)).

Certain of these products are equal to an alignment of the vector space LF. For example:

$$h_6 h_7=x^5 \cdot x^6=x^{11}=h_{15}, \; h_{10}h_{10}=y \cdot y=y^2=x^{17}+y=h_{27}+h_{10}.$$

In such cases, we write $$h_i h_j = \sum_{v=1}^{n-k} \lambda_v h_v,$$

and the element $S_{ij}$ of the matrix S is defined by $$S_{ij} = \sum_{v=1}^{n-k} \lambda_v s_v. \qquad (3)$$

The order of the functions $h_i$ has been chosen such that, for any value of i, the product of $h_i$ by $h_j$ belongs to LF for all the values of j between 1 and a certain limit w(i), where w(i) is a decreasing function. In the digital example considered (see FIG. 2), w(i) becomes less than i from $i=u_{max}=13$, with $W(u_{max})=12$.

On the other hand, certain products $h_i h_j$ do not belong to LF. This is the case, for example, for $$h_6 h_{29}=x^5 \cdot x^{18}=x^{23}, \text{ and for: } h_{17}h_{10}=x^{12} \cdot y.$$

In such cases, it is not in fact necessary to define the value of the corresponding element $S_{ij}$. This is because the algorithm according to the invention, of which a description will be found below, does not use the elements $S_{ij}$ for which j is less than or equal to w(i). This function w thus represents a "boundary" between the elements calculated according to equation (3), which fill the upper left corner of the matrix S, and the indeterminate elements of that matrix (see FIG. 3, which represent the first 13 lines of the matrix S).

As was indicated earlier, the algorithm according to the invention uses linear manipulations of the lines. It will be recalled that the linear manipulations of the lines of a matrix $\Sigma$ to obtain a matrix $\Sigma'$ may be represented by the pre-multiplication of the matrix $\Sigma$ by a reversible matrix L, i.e.

$$\Sigma'=L \cdot \Sigma.$$

Let $\mu$ be the number of lines of $\Sigma$, and let L be the matrix with $\mu$ columns which makes the elements of the line $\alpha$ of $\Theta'$ zero from the column j=1 to the column j=w($\mu$). In other words, L satisfies:

$$0 = \sum\nolimits'_{\alpha j} = \left(L \cdot \sum\right)_{\alpha j} = \sum_{i=1}^{\mu} L_{\alpha i} \sum\nolimits_{ij}, \text{ for } j=1,2,\ldots,w(\mu).$$

If we then define $$l_i = L_{\alpha i} \; (i=1,2,\ldots,\mu), \qquad (4)$$

it will be seen that we have obtained $$\sum_{i=1}^{\mu} l_i \sum\nolimits_{ij} = 0$$

as desired (system of equations (1)). Thus, the numbers $l_i$ sought form the α-th line of L. However, L may of course be written $$L=L \cdot I,$$

where I is the identity matrix, such that in practice L is obtained by applying to the identity matrix the same linear manipulations of lines as those which are applied to the matrix $\Sigma$ to obtain $\Sigma'$.

The linear manipulations implemented during the course of the algorithms presented below by way of example, operate, for increasing values of the iteration variable u, on the line S[u] of index u of the matrix $S^u$, starting at u=2. The same linear manipulations are applied successively to the identity matrix I, of which the lines resulting from these manipulations are denoted L[u]. The line S[u] operated upon is replaced by the sum of that same line and of a preceding line of index i<u multiplied by an appropriate coefficient; conventionally, these operations, completed according to needs by permutations of columns, are adapted to progressively transform the matrix S into a triangular matrix (with zeros in the bottom left corner). The algorithm terminates when a matrix $S^\lambda$ is found which has a line of index less than or equal to $\lambda$ whose elements are zero over the first $w(\lambda)$ columns.

Figure 4:
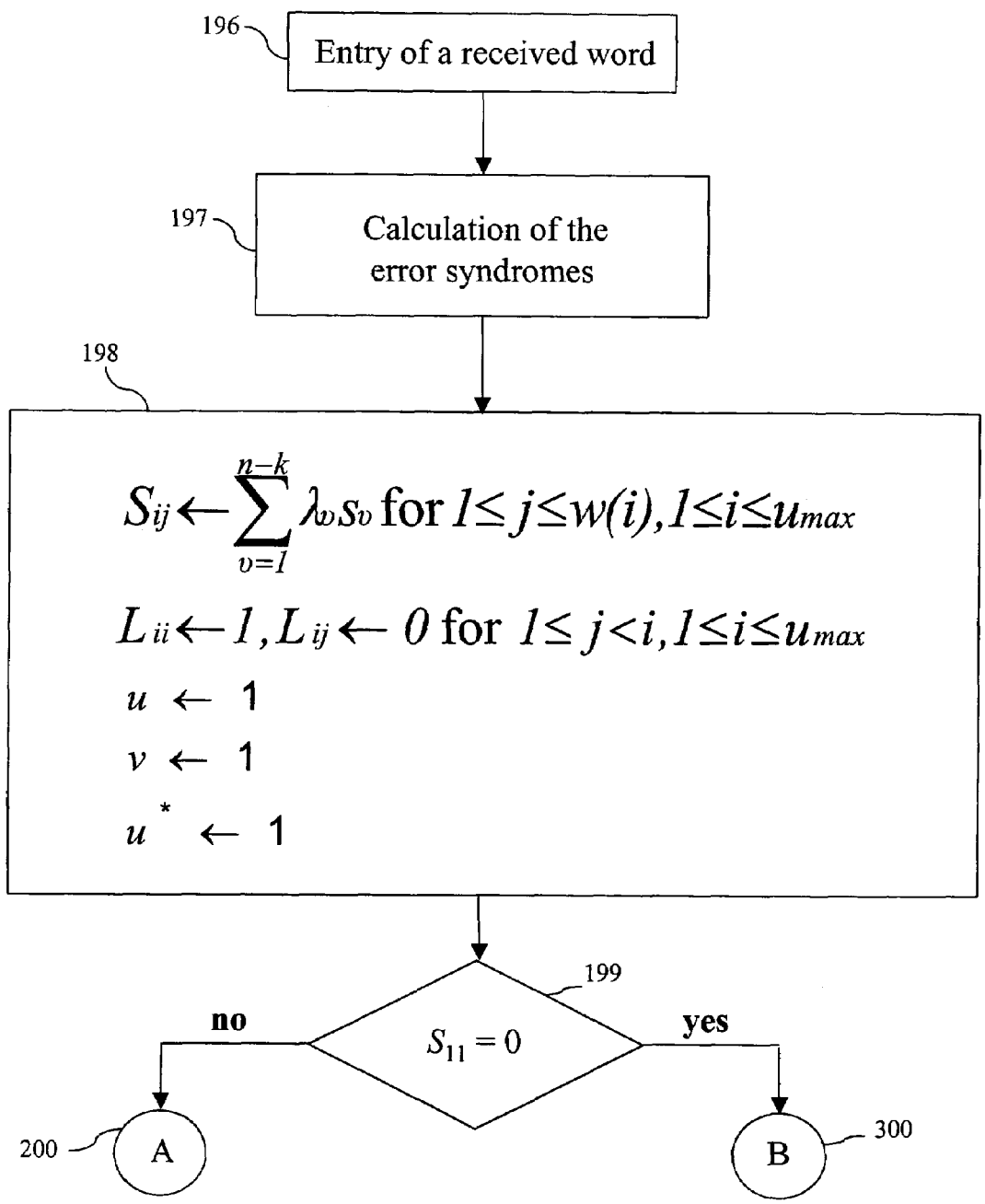
FIG. 4 is a flow chart representing the initial steps of a method of correcting errors according to the invention.
Figure 5A:
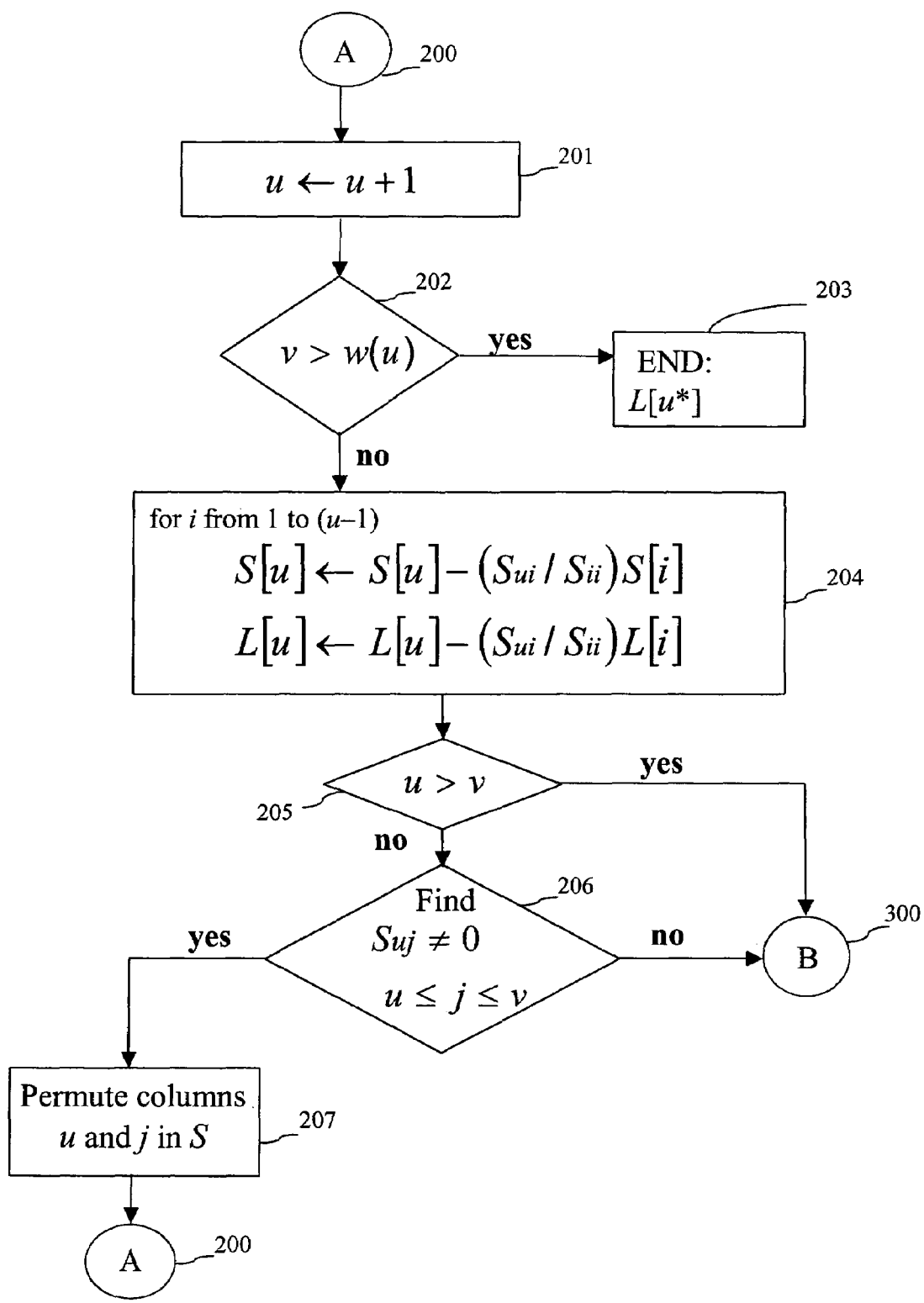
FIGS. 5a and 5b are flow charts representing the following main steps of that method of correcting errors according to the invention.
Figure 5B:
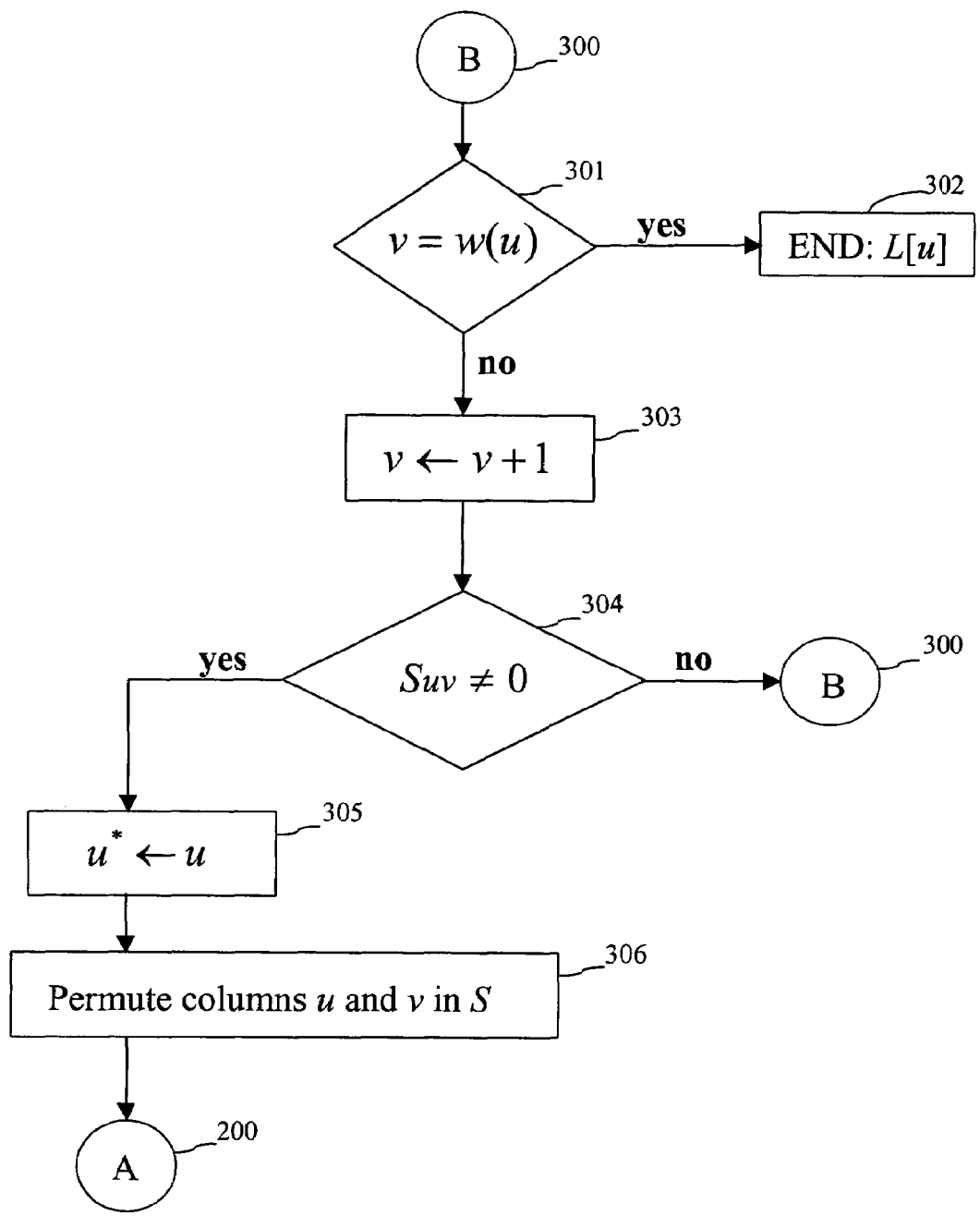

With reference to FIGS. 4, 5a and 5b, a first embodiment of the invention will now be described, in which $\lambda_0$ is calculated, which, it may be recalled, is the smallest value of $\mu$ for which the system (1) has a non-trivial solution. In this embodiment, each matrix $S^u$ has a number of columns equal to w(u).

FIG. 4 is a flow chart representing the initial steps of an error correction method according to the invention, which is implemented each time the error correction unit 107 takes a new received word (in the form of a series of symbols belonging to said alphabet) at step 196 of that method.

First, at step 197, the error syndromes of the received word are calculated, that is to say the (n−k) components $s_v$ of the vector.

$\underline{s} = H \underline{r}^T$, then, at step 198, these syndromes are inserted into the matrix S constructed according to equation (3) and cut of at $u_{max}$ lines (as in FIG. 3). The matrix L is initialized to the identity matrix of dimension $u_{max}$.

The integers u and v respectively represent the current line and column indices. The role of the integer u* will be explained below.

It is then sought to place the first Gauss pivot in position $S_{11}$. If the value initially present is already non-zero, as verified at step, 199, the sub-algorithm A is proceeded to (step 200). Otherwise, the sub-algorithm B is proceeded to (step 300).

The rest of the algorithm is constituted by a series of steps, in which each step consists either of applying the sub-algorithm A, or of applying the sub-algorithm B.

The sub-algorithm A, which is illustrated in FIG. 5a, serves essentially to go down one line in "S" (step 201).

Step 202 represents a stop test of the algorithm which will be explained further on. If the algorithm must be continued, the new line is manipulated (step 204) so as to cancel its elements situated in the first (u−1) columns. The matrix $S^u$ has thus been obtained for the value u considered.

At step 205, the current number of lines u is compared with the current number of columns v. If it turns out that u is greater than v, the sub-algorithm B is proceeded to (step 300).

If u is less than or equal to v, then at step 206 the line u is gone through for columns j≧u, to search for the first non-zero element.

If one is found before the column of index (v+1), the calculation of the matrix $S^{u+1}$ is commenced exchanging, at step 207, the column j in which that non-zero element is found with column u (except if j=u), in order to for this element to serve as Gauss pivot at position (u,u), and the starting point 200 of the sub-algorithm A is returned to, in order to terminate the calculation of $S^{u+1}$ by a manipulation involving line (u+1).

If on the other hand all the elements of the line u are zero up to and including that in column v, the sub-algorithm B is proceeded to (step 300).

Sub-algorithm B, which is represented in FIG. 5b, serves essentially to go forward by one column in "S" (step 303).

If it turns out, at the commencement of that sub-algorithm (step 301), that all the elements of the line u up to and including that in column w(u) are zero, this means in fact that the end of the algorithm has been attained (step 302): the number $\lambda_0$ sought is thus equal to the current value of u.

It should be noted, since at the start $I_{i\lambda_0}=0$ for $i<\lambda_0$, that the linear manipulations involving the lines of L of index $i\leq\lambda_0$ do not modify the elements of these lines situated in column $\lambda_0$. Consequently, in the case of the stop criterion 301, the result $l_{\lambda_0}=L_{\lambda_0\lambda_0}=1$ is arrived at, since $I_{\lambda_0\lambda_0}=1$.

If, on the other hand, v is still less than w(u), going through of line u to the following columns is continued (by increasing v, step 303), to search for the first non-zero element (step 304).

If one is thus found before v becomes equal to w(u), then first, at step 305, the current value of u is attributed to the variable u*. Thus, the line of index u* of $S^u$ has a non-zero element in its column v, but all the elements of that line situated in columns 1 to (v−1) are zero. Thus at this stage the matrix L satisfies:

$$\sum_{i=1}^{u^*} L_{u^*i} S_{ij} = 0, \text{ for } j = 1, 2, \ldots, (v-1), \qquad (5)$$

where $L_{u^*u^*}$, in particular, is equal to 1.

Next, at step 306, the calculation of the matrix $S^{u+1}$ is commenced exchanging the column v with column u (except if v=u), in order for the non-zero element found at step 304 to serve as Gauss pivot at position (u,u), and sub-algorithm A is returned to, in order to terminate the calculation of $S^{u+1}$ by a manipulation involving line (u+1).

We now return to the stop criterion 202. If v>w(u), it is thereby deduced that the number $\lambda_0$ sought is equal to the current value of u, and thus: v−1≧w($\lambda_0$). This is because, if step 305 which preceded that step 202 is returned to, it is found that the elements of the line u* of $S^{u^*}$ were zero at least from column 1 to column w($\lambda_0$). Taking equation (5) into account it can be seen that if we take:

$l_i = L_{u^*i}$ for $i=1,2,\ldots,u^*$, and $l_i = 0$ for $i=(u^*+1),\ldots,\lambda_0$, we have actually obtained a non-trivial solution to the system of equations (1), where $\lambda_0$ corresponds to the minimum value of u for which such a solution exists. It will be noted that, in the case of the stop criterion 202, the result $l_{u^*}=L_{u^*u^*}=1$ is arrived at. Note also that in this case it has not been necessary to calculate the line $S[\lambda_0]$.

According to a second embodiment of the present invention, the "extended dimension" $\lambda_D$ concerned by the extended modified algorithm is determined. The steps of this variant form of the invention are essentially the same as the steps of the embodiment described above, apart from the fact that (the case arising) v is not incremented beyond w($\mu_D$); thus, the stop criterion 202 becomes: v>min (w(u),w($\mu_D$)), and the stop criterion 301 becomes: v=min (w(u),w($\mu_D$)) (where "min" designates the minimum). As mentioned by way of introduction, this variant of the algorithm according to the invention allows a saving to be made in terms of storage. For example, for the code considered above, $\mu_D=7$ is found; as w(7)=20, we will have w($\lambda_D$)≦20, such that only the first 20 columns of the matrix S will be needed.

Whatever the embodiment of the invention, its results may be applied to the correction of transmission errors in the word considered as if the modified basic algorithm or the extended modified algorithm had been implemented. For example, according to a known method of error correction, the following "error-locating polynomial" will be formed:

$$\Lambda(x, y) \equiv \sum_{i=1}^{\lambda} l_i h_i(x, y),$$

the roots of which serve to find the position of the errors in the received word (for further details, reference may be made for example to the article by Tom Høholdt and Ruud Pellikaan cited above. It will be noted that, with $\lambda$ fixed, the set of associated coefficients $l_i$ is not unique; for example, it is clearly possible here to multiply all the numbers $l_i$ by the same constant without this affecting the location of the transmission errors.

Figure 6:
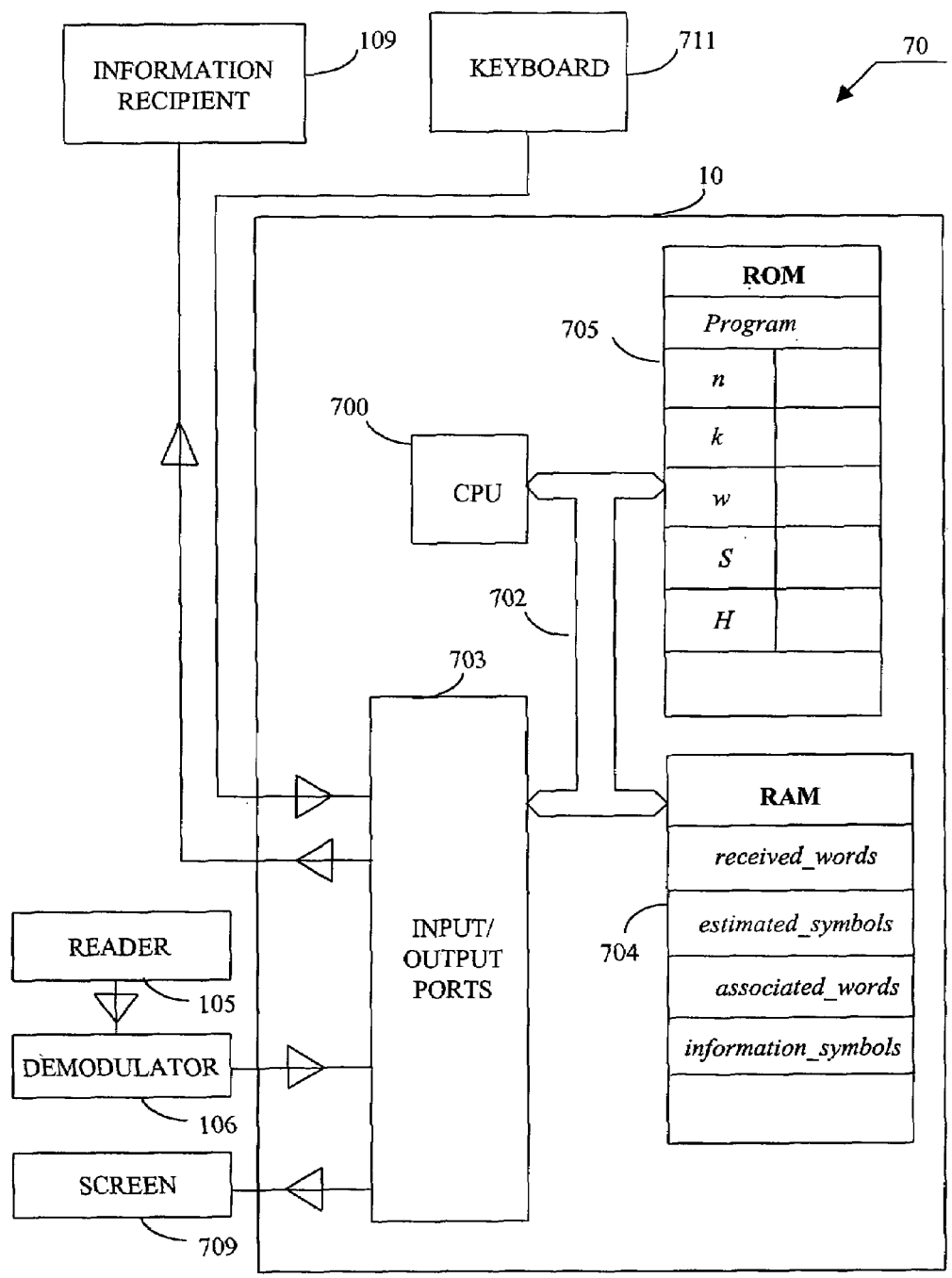
FIG. 6 shows an apparatus for receiving digital signals incorporating a decoder according to the invention.

The block diagram of FIG. 6 represents an apparatus for receiving digital signals 70 incorporating the decoder 10. This apparatus 70 comprises a keyboard 711, a screen 709, a recipient of external information 109, a data reader 105 and a demodulator 106, conjointly connected to input/output ports 703 of the decoder 10 which is produced here in the form of a logic unit.

The decoder 10 comprises, connected together by an address and data bus 702:
- a central processing unit 700,
- a random access memory (RAM) 704,
- read only memory (ROM) 705; and
- said input/output ports 703.

Each of the elements illustrated in FIG. 6 is well known to the person skilled in the art of microcomputers and mass storage systems and, more generally, of information processing systems. These known elements are therefore not described here. It should be noted, however, that:
- the information recipient 109 could, for example, be an interface peripheral, a display, a modulator, an external memory or other information processing system (not shown), and could be adapted to receive sequences of signals representing speech, service messages or multimedia data in particular of the IP or ATM type, in the form of sequences of binary data,
- the reader 105 is adapted to read data recorded on a carrier such as a magnetic or magneto-optic disk.

The random access memory 704 stores data, variables and intermediate processing results, in memory registers bearing, in the description, the same names as the data whose values they store. The random access memory 704 contains in particular the following registers:
- registers "received_words", in which the received words are kept,
- a register "estimated_symbols", in which are stored the symbols from a received word in course of correction,
- a register "associated_words", in which are stored the symbols of the "associated code words", and
- a register "information_symbols", in which are stored the symbols resulting from the redundancy suppression.

The read only memory 705 is adapted to store, in registers which, for convenience, have the same names as the data which they store:
- the operating program of the central processing unit 700, in a register "program",
- the length of each code word in a register "n",
- the number of information symbols in each code word, in a register "K",
- the list of the values of w(u) for $1 \leq u \leq u_{max}$, such as illustrated in FIG. 2, in a register "w",
- the list of the coefficients of the syndromes matrix, such as illustrated in FIG. 3, in a register "S", and
- the length of the parity matrix of the code, in a register "H", An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

The invention claimed is:

1. A method performed by a decoding device for decoding a one-point algebraic geometric code of dimension k and length n, wherein, in order to identify a position of errors in a received word, a syndromes matrix S, of size (n−k)×(n−k), is defined, of which elements $S_{ij}$ of each line I are calculated, for j between 1 and w(I), wherein boundary w is a decreasing function, using syndrome s of the received word, said method comprising matrix construction steps numbered by u, during which matrices $S^u$ are constructed starting with $S^1 = S$, and wherein each matrix $S^u$ for u>1 is obtained from matrix $S^{u-1}$ by performing:
where appropriate, permutations on columns of the matrix $S^{u-1}$, then
linear manipulations involving a line of index u of the matrix so obtained,
and wherein the construction of matrices terminates when:
either $S^u_{uj} = 0$ for all j between 1 and w(u),
or there is an integer $u^* \leq (u-1)$ such that $S^{u^*}_{u^*j} = 0$ for all j between 1 and w(u).

2. A method performed by a decoding device for decoding a one-point algebraic geometric code of dimension k and length n, wherein, in order to identify a position of errors in a received word, a syndromes matrix S, of size (n−k)×(n−k), is defined, of which elements $S_{ij}$ of each line i are calculated, for j between 1 and w(i), wherein boundary w is a decreasing function, using syndrome s of the received word, said method comprising matrix construction steps numbered by u, during which matrices $S^u$ are constructed starting with $S^1 = S$, and wherein each matrix $S^u$ for u>1 is obtained from matrix $S^{u-1}$ by performing:
where appropriate, permutations on columns of the matrix $S^{u-1}$, then
linear manipulations of a line of index u of the matrix so obtained, and wherein the last step is:
either the step of number u = $\lambda$, if an integer $\lambda$ is determined such that $S^\lambda_{\lambda j} = 0$ for all j between 1 and w($\lambda$),
or the step of number u=($\lambda$−1), if an integer $\lambda$ and an integer $u^*$ are determined, with $u^* < \lambda$, such that $S^{u^*}_{u^*j} = 0$ for all j between 1 and w($\lambda$).

3. A decoding method according claims 1 or 2, in which a number of lines of each matrix $S^u$ is cut off at $U_{max}$, wherein $U_{max}$ is a smallest integer i for which w(i) is less than i.

4. A decoding method according to claims 1 or 2, in which a number of columns of each matrix $S^u$ is cut off at w(u).

5. A decoding method according to claims 1 or 2, in which a number of columns of each matrix $S^u$ is cut off at w($\mu_D$) for u between 1 and Duursma's minimum $\mu_D$, and at w(u) for u greater than $\mu_D$.

6. Non-removable data storage means, comprising computer program code instructions for the execution of the steps of a method according to claims 1 or 2.

7. Partially or wholly removable data storage means, comprising computer program code instructions for the execution of the steps of a method according to claims 1 or 2.

8. An error correction device for decoding a one-point algebraic geometric code of dimension k and length n, adapted to identify a position of errors in a received word, and comprising means for defining a syndromes matrix S, of size (n−k)×(n−k), of which elements $S_{ij}$ of each line i are calculated, for j between 1 and w(i), wherein boundary w is a decreasing function, using syndrome s of the received word, said error correction device further comprising means for constructing matrices $S^u$ numbered by u, with $S^1=S$, each matrix $S^u$ for u>1 being obtained from matrix $S^{u-1}$ by performing:

where appropriate, permutations on columns of the matrix $S^{u-1}$, then linear manipulations involving a line of index u of the matrix so obtained, and comprising means for stopping the construction of the matrices when:

either $S^u_{uj}=0$ for all j between 1 and w(u), or there is an integer u*≦(u−1) such that $S^{u^*}_{u^*j}=0$ for all j between 1 and w(u).

9. An error correction device according to claim 8, further comprising means for cutting off a number of lines of each matrix $S^u$ at $U_{max}$, wherein $U_{max}$ is a smallest integer i for which w(i) is less than i.

10. An error correction device according to claims 8 or 9, further comprising means for cutting off a number of columns of each matrix $S^u$ at $w(\mu_D)$ for u between 1 and Duursma's minimum $\mu_D$, and at w(u) for u greater than $\mu_D$.

11. A decoder, comprising:

at least one error correction device according to claims 8 or 9, and at least one redundancy suppression device.

12. Apparatus for receiving encoded digital signals, comprising a decoder according to claim 11, and means for demodulating the encoded digital signals.

13. A computer system, comprising a decoder according to claim 11, and further comprising:

at least one hard disk, and at least one means for reading said hard disk.

14. An error correction device according to claims 8 or 9, further comprising means for cutting off a number of columns of each matrix $S^u$ at w(u).

15. A computer-readable medium storing computer executable code for implementing a method of decoding a one-point algebraic geometric code of dimension k and length n, wherein, in order to identify a position of errors in a received word, a syndromes matrix S, of size (n−k)×(n−k), is defined, of which elements $S_{ij}$ of each line I are calculated, for j between 1 and w(I), wherein boundary w is a decreasing function, using syndrome s of the received word, said method comprising matrix construction steps numbered by u, during which matrices $S^u$ are constructed starting with $S^1=S$, and wherein each matrix $S^u$ for u>1 is obtained from matrix $S^{u-1}$ by performing:

where appropriate, permutations on columns of the matrix $S^{u-1}$, then linear manipulations involving a line of index u of the matrix so obtained, and wherein the construction of matrices terminates when:

either $S^u_{uj}=0$ for all j between 1 and w(u), or there is an integer u*<(u−1) such that $S^{u^*}_{u^*j}=0$ for all j between 1 and w(u).

16. A computer-readable medium storing computer executable code for implementing a method of decoding a one-point algebraic geometric code of dimension k and length n, wherein, in order to identify a position of errors in a received word, a syndromes matrix S, of size (n−k)×(n−k), is defined, of which elements $S_{ij}$ of each line i are calculated, for j between 1 and w(i), wherein boundary w is a decreasing function, using syndrome s of the received word, said method comprising matrix construction steps numbered by u, during which matrices $S^u$ are constructed starting with $S^1=S$, and wherein each matrix $S^u$ for u>1 is obtained from matrix $S^{u-1}$ by performing:

where appropriate, permutations on columns of the matrix $S^{u-1}$, then linear manipulations of a line of index u of the matrix so obtained, and wherein the last step is:

either the step of number u=λ, if an integer λ is determined such that $S^\lambda_{\lambda j}=0$ for all j between 1 and w(λ), or the step of number u=(λ−1), if an integer λ and an integer u* are determined, with u*<λ, such that $S^{u^*}_{u^*j}=0$ for all j between 1 and w(λ).

* * * * *

UNITED STATES PATENT AND TRADEMARK OFFICE
CERTIFICATE OF CORRECTION

PATENT NO.        : 7,409,629 B2
APPLICATION NO. : 10/673288
DATED             : August 5, 2008
INVENTOR(S)       : Frederic Lehobey et al.

It is certified that error appears in the above-identified patent and that said Letters Patent is hereby corrected as shown below:

TITLE PAGE ITEM [56] OTHER PUBLICATIONS

Foreign Patent Documents
"decoing if" should read --decoding of--.

COLUMN 2

Line 7, "cases" should read --cases be--.
Line 56, "particular" should read --particular,--.
Line 57, "(see" should read --(see,--.
Line 58, "example" should read --example,--.

COLUMN 3

Line 13, "decoder. (see for example" should read --decoder (see, for example,--.
Line 30, "a" should read --an--.

COLUMN 4

Line 22, "is in particular" should read --is, in particular,--.

COLUMN 5

Line 13, "Here too" should read --Here, too,--.
Line 15, "However" should read --However,--.
Line 24, "made for example" should read --made, for example,--.

COLUMN 6

Line 4, "an" should read --a--.
Line 35, "thus" should read --thus,--.
Line 36, "course" should read --course,--.

UNITED STATES PATENT AND TRADEMARK OFFICE
CERTIFICATE OF CORRECTION

PATENT NO. : 7,409,629 B2
APPLICATION NO. : 10/673288
DATED : August 5, 2008
INVENTOR(S) : Frederic Lehobey et al.

It is certified that error appears in the above-identified patent and that said Letters Patent is hereby corrected as shown below:

COLUMN 8

Line 44, "may for example" should read --may, for example,--.

COLUMN 10

Line 34, "θ'" should read --Σ'--.

Line 40, " $0 = \Sigma'_{qj} = (L \cdot \Sigma)_{qj} = \sum_{i=1}^{\mu} L_{ij} \Sigma_{ij}, \text{ for } j = 1, 2, \ldots, w(\mu)$ " should read -- $0 = \Sigma'_{qj} = (L \cdot \Sigma)_{qj} = \sum_{i=1}^{\mu} L_{qj} \Sigma_{ij}, \text{ for } j = 1, 2, \ldots, w(\mu)$ --.

Line 50, " $\sum_{i=1}^{\mu} l_i \sum_{ij} = 0$ " should read -- $\sum_{i=1}^{\mu} l_i \sum_{ij} = 0$ --.

COLUMN 11

Line 38, "step," should read --step--.
Line 60, "order to" should read --order--.
Line 65, "If on the other hand" should read --If, on the other hand,--.

UNITED STATES PATENT AND TRADEMARK OFFICE
CERTIFICATE OF CORRECTION

PATENT NO. : 7,409,629 B2
APPLICATION NO. : 10/673288
DATED : August 5, 2008
INVENTOR(S) : Frederic Lehobey et al.

It is certified that error appears in the above-identified patent and that said Letters Patent is hereby corrected as shown below:

COLUMN 13

Line 14, "made" should read --made,--.
　　Line 15, "example" should read --example,--.

COLUMN 14

Line 7, ""it,"" should read --"it."--.
　　Line 11, "could for example" should read --could, for example,--.
　　Line 55, Claim 2 "according" should read --according to--.

COLUMN 16

Line 36, Claim 16 "linear" should read --¶ linear--.

Signed and Sealed this

Thirtieth Day of December, 2008

JON W. DUDAS
*Director of the United States Patent and Trademark Office*